United States Patent
Chen et al.

(10) Patent No.: US 10,734,385 B2
(45) Date of Patent: Aug. 4, 2020

(54) ORIENTATION ENGINEERING IN COMPLEMENTARY METAL OXIDE SEMICONDUCTOR FIN FIELD EFFECT TRANSISTOR INTEGRATION FOR INCREASED MOBILITY AND SHARPER JUNCTION

(71) Applicant: INTERNATIONAL BUSINESS MACHINES CORPORATION, Armonk, NY (US)

(72) Inventors: Chia-Yu Chen, White Plains, NY (US); Bruce B. Doris, Slingerlands, NY (US); Hong He, Schenectady, NY (US); Rajasekhar Venigalla, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/548,265

(22) Filed: Aug. 22, 2019

(65) Prior Publication Data
US 2019/0378840 A1     Dec. 12, 2019

Related U.S. Application Data

(60) Continuation of application No. 15/285,000, filed on Oct. 4, 2016, now Pat. No. 10,453,841, which is a
(Continued)

(51) Int. Cl.
*H01L 29/04* (2006.01)
*H01L 27/092* (2006.01)
(Continued)

(52) U.S. Cl.
CPC .......... *H01L 27/0924* (2013.01); *H01L 21/18* (2013.01); *H01L 21/823821* (2013.01);
(Continued)

(58) Field of Classification Search
CPC ...................................... H01L 29/045
See application file for complete search history.

(56) References Cited

U.S. PATENT DOCUMENTS 7,217,606 B2   5/2007   Forbes et al.
7,569,857 B2   8/2009   Shaheen et al.
(Continued)

OTHER PUBLICATIONS

List of IBM Patents or Patent Applications Treated as Related dated Aug. 22, 2019, 2 pages.
(Continued)

*Primary Examiner* — Peniel M Gumedzoe
*Assistant Examiner* — Christopher A Johnson
(74) *Attorney, Agent, or Firm* — Tutunjian & Bitetto, P.C.; Vazken Alexanian

(57) ABSTRACT

A semiconductor device that includes at least one germanium containing fin structure having a length along a <100> direction and a sidewall orientated along the (100) plane. The semiconductor device also includes at least one germanium free fin structure having a length along a <100> direction and a sidewall orientated along the (100) plane. A gate structure is present on a channel region of each of the germanium containing fin structure and the germanium free fin structure. N-type epitaxial semiconductor material having a square geometry present on the source and drain portions of the sidewalls having the (100) plane orientation of the germanium free fin structures. P-type epitaxial semiconductor material having a square geometry is present on
(Continued)

the source and drain portions of the sidewalls having the (100) plane orientation of the germanium containing fin structures.

20 Claims, 4 Drawing Sheets

Related U.S. Application Data division of application No. 14/865,667, filed on Sep. 25, 2015, now Pat. No. 10,529,717.

(51) Int. Cl.
H01L 29/78 (2006.01)
H01L 29/165 (2006.01)
H01L 21/18 (2006.01)
H01L 27/12 (2006.01)
H01L 21/8238 (2006.01)
H01L 21/84 (2006.01)
H01L 29/66 (2006.01)

(52) U.S. Cl.
CPC ........ H01L 21/845 (2013.01); H01L 27/1211 (2013.01); H01L 29/045 (2013.01); H01L 29/165 (2013.01); H01L 29/66795 (2013.01); H01L 29/7848 (2013.01)

(56) References Cited

U.S. PATENT DOCUMENTS

| 7,649,230 B2 | 1/2010 | Shin et al. |
| 8,946,033 B2 | 2/2015 | Adam et al. |
| 2011/0147804 A1 | 6/2011 | Mehandru et al. |
| 2013/0320294 A1 | 12/2013 | Cappellani et al. |
| 2014/0299923 A1 | 10/2014 | Chang |
| 2015/0014789 A1 | 1/2015 | Xiong et al. |

OTHER PUBLICATIONS

M. L. Lee et al., "Challenges in epitaxial growth of SiGe buffers on Si (111), (110), and (112)," Proceedings of the Fourth International Conference on Silicon Epitaxy and Heterostructures (ICSI-4)—ICSI-4, 5 Jun. 2006, pp. 136-139, vol. 508, Issues 1-2.

K. Shin et al., "Dual Stress Capping Layer Enhancement Study for Hybrid Orientation FinFET CMOS Technology," IEEE International Electron Devices Meeting, 2005, IEDM Technical Digest, Dec. 5-5, 2005, pp. 988-991.

C. D. Young et al., "Critical Discussion on (100) and (110) orientation dependent transport: nMOS Planar and FinFET," 2011 Symposium on VLSI Technology Digest of Technical Papers, Jun. 14-16, 2011, pp. 18-19.

U.S. Office Action issued in U.S. Appl. No. 16/548,216, dated Oct. 2, 2019, pp. 1-33.

US 10,734,385 B2

ORIENTATION ENGINEERING IN COMPLEMENTARY METAL OXIDE SEMICONDUCTOR FIN FIELD EFFECT TRANSISTOR INTEGRATION FOR INCREASED MOBILITY AND SHARPER JUNCTION

BACKGROUND

Technical Field

The present disclosure relates to semiconductor devices, such as semiconductor devices including fin structures. The present disclosure further relates to processing of materials suitable for use in fin including structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method of forming a semiconductor device is provided that includes forming a plurality of fin structures from a silicon containing semiconductor substrate having a (100) plane orientation, wherein said fin structures have a length in a <100> direction and a sidewall along the (100) plane. At least one of the fin structures are converted to germanium containing type fin structures, wherein at least one remaining of the fin structures is germanium free. N-type epitaxial semiconductor material having rectangular growth is formed on the source and drain portions of the sidewalls having the (100) plane of the fin structures that are germanium free, and P-type epitaxial semiconductor material having rectangular growth is formed on the source and drain portions of the sidewalls having the (100) plane of the germanium containing type fin structures.

In another embodiment, a method of forming a semiconductor device is provided that includes forming a plurality of fin structures from a silicon containing semiconductor substrate having a (100) plane orientation, wherein said fin structures have a length in a <100> direction and a sidewall along the (100) plane. At least one of the fin structures are converted to germanium containing type fin structures, wherein at least one remaining of the fin structures is germanium free. Gate structures are formed on channel region portions of said germanium containing type fin structures and the fin structures that are germanium free. N-type epitaxial silicon having rectangular growth is formed on the sidewalls having the (100) plane of the fin structures that are germanium free on opposing sides of the channel region. P-type epitaxial silicon having rectangular growth is formed on the sidewalls having the (100) plane of the germanium containing type fin structure on opposing sides of the channel region.

In another aspect, a semiconductor device is provided that includes at least one germanium containing fin structure having a length along a <100> direction and a sidewall orientated along the (100) plane, and at least one germanium free fin structure having a length along a <100> direction and a sidewall orientated along the (100) plane. A gate structure on a channel region of each of the germanium containing fin structure and the germanium free fin structure. N-type epitaxial semiconductor material having a square geometry is formed on the source and drain portions of the sidewalls having the (100) plane orientation of the germanium free fin structures. P-type epitaxial semiconductor material having a square geometry is formed on the source and drain portions of the sidewalls having the (100) plane orientation of the germanium containing fin structures.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
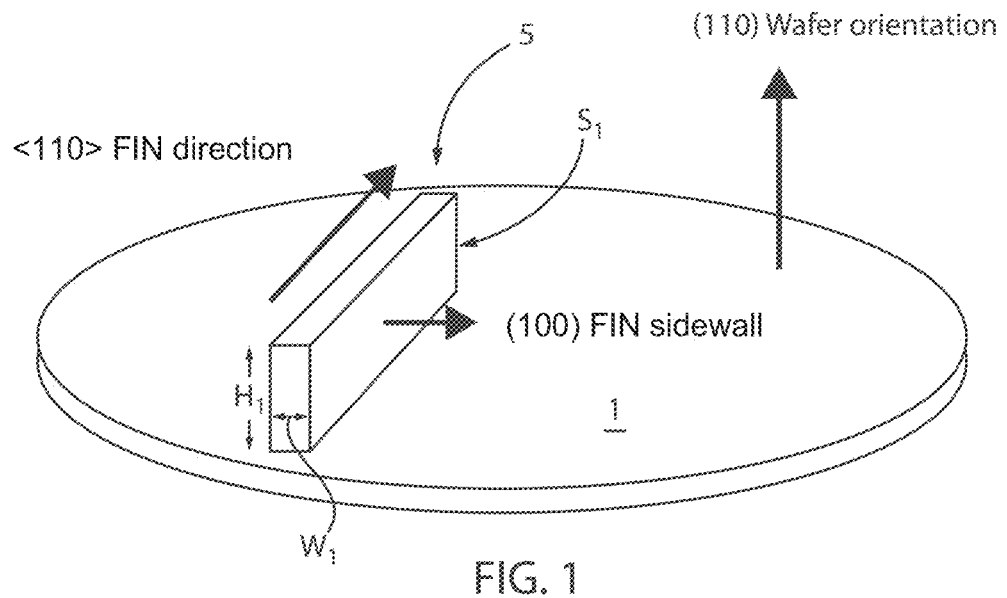
FIG. 1 is a perspective view that depicting forming a plurality of fin structures from a silicon containing semiconductor substrate having a (100) plane orientation, wherein said fin structures have a length in a <110> direction and a sidewall along the (100) plane, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a FinFET semiconductor devices in which the fin structures are formed with an orientations, i.e., along crystal planes and directions, and composed of materials that provide for performance enhancements for p-type and n-type semiconductor devices. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A finFET is a semiconductor device that positions the channel region of the semiconductor device in a fin structure. High channel mobility (less effective mass/higher source velocity) and better/easier epitaxial growth process may be desired in some applications in increasingly scaled complementary metal oxide semiconductor (CMOS) FinFET integration. It has been determined that in prior methods of forming FinFETs when employing a (100) wafer and <110> Fin direction, diamond shape epitaxial semiconductor material causes integration challenges in un-merged epitaxial semiconductor material (for scaled contacted poly pitch (CPP)) and server (311) defects in merged epitaxial semiconductor material. Moreover conventional <110> conduction plane has worse electron mobility than <100> plane. Worse electron mobility, difficult EPI process, and defect control challenge already shown much bad nFET Ron-DIBL. Ron DIBL is the on-resistance verses drain induced barrier lowering plot, which is a metric for transistor performance measurement. Lower Ron at constant DIBL means a better performance.

In some aspects of the present disclosure orientation engineering for CMOS FinFET integration is proposed, which provides for both increased electron and hole mobility, achieves a sharper junction, and provides a more robust epitaxial semiconductor growth process. In some embodiments, the method may begin with a (110) wafer orientation substrate and forming from the substrate a fin structure having a length along the <110> direction and a (100) sidewall. In some embodiments, the (100) fin sidewall provides rectangular shaped epitaxially grown semiconductor material, which can be desirable for defect-less source and drain regions and SiGe condensation. It has been determined that p-type semiconductor devices, such as p-type FinFETs, are sensitive in <110> Fin direction, i.e., the fin length that is parallel to the length of the channel region separating the source and drain regions, provides for hole mobility that can be improved in (100) Fin sidewall through SiGe cladding condensation and strain engineering. The methods and structures of the present disclosure are now discussed with more detail referring to FIGS. 1-6.

FIG. 1 depicts one embodiment of forming a plurality of silicon including fin structures 5 from a semiconductor substrate 1. Although FIG. 1 only depicts a single fin structure 5, it is noted that any number of fin structures 5 may be formed from the semiconductor substrate 1. The fin structures 5 are typically formed from a (110) surface of the semiconductor substrate 1. Wafers are typically grown from crystal having a regular crystal structure, with silicon having a diamond cubic structure with a lattice spacing of 5.430710 Å (0.5430710 nm). When cut into wafers, i.e., semiconductor substrates 1, the cut surface is aligned in one of several relative directions known as crystal orientations. Orientation is defined by the Miller index. In accordance with some embodiments, the upper surface, i.e., upper face, of the substrate 1 has a (110) orientation.

In some embodiments, a plurality of silicon including fin structures 5 may be formed from a semiconductor on insulator (SOI) substrate or a bulk semiconductor substrate (as depicted in FIG. 1). The SOI substrate that may provide the semiconductor substrate 1 may include at least a semiconductor on insulator (SOI) layer overlying a dielectric layer, in which a base semiconductor layer may be present underlying the dielectric layer. The semiconductor material that provides the SOI layer may be a silicon including material. As used herein, the term "silicon including" in combination with "germanium free", as used to describe semiconductor substrate 1 and the subsequently formed plurality of fin structures 5, means a material layer of silicon that is substantially free of germanium. In some embodiments, by being substantially free of germanium, it is meant that the germanium content is less than 5 at. %. For example, the germanium content may be less than 1 at. %, and in some examples, the silicon including semiconductor substrate and/or silicon including fin structures 5 may be entirely free of germanium (Ge). In some embodiments, the silicon including material that provides the semiconductor substrate 1 may include, but is not limited to silicon, single crystal silicon, multicrystalline silicon, polycrystalline silicon, amorphous silicon, strained silicon, silicon doped with carbon (Si:C), silicon alloys or any combination thereof. In one example, the silicon including semiconductor substrate 1 composed of greater than 99 at. % silicon (Si), e.g, 100 at. % silicon (Si).

The plurality of fin structures 5 may be formed from the semiconductor substrate 1, e.g., SOI substrate, using photolithography and etch processes. The plurality of fin structures 5 may be patterned from the semiconductor substrate 1 to provide a length along, i.e., parallel to, the <110> crystalline direction, as depicted in FIG. 1. The length of the fin structures 5 is typically defined from an outermost edge of a source region portion of the fin structure across the channel region of the fin structure to an outermost edge of the drain region portion of the fin structure. The plurality of fin structures 5 are also patterned to have a sidewall 51 of the fin structure 5 having a (100) orientation, as depicted in FIG. 1.

In one embodiment, the patterning process used to define each of the fin structures 10 is a sidewall image transfer (SIT) process. The SIT process can include forming a mandrel material layer (not shown) on the material layer that provides the fin structures 10, such as the SOI layer of an SOI substrate, or the bulk semiconductor substrate upper surface. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 10, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 5.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structures 5, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structures 5. Following etching, i.e., pattern transfer, the SIT process may conclude with removing the dielectric spacers using an etch process or a planarization process.

It is noted that the aforementioned spacer image transfer (SIT) process is only one method of forming the fin structures 5. In another embodiment, each of the fin structures 5 may be formed using a photoresist etch mask. Specifically, in one example, a photoresist mask is formed overlying the semiconductor composition layer which provides the fin structures 5. The exposed portions of the semiconductor layer that provides the fin structures 5 that are not protected by the photoresist mask are removed using a selective etch process. To provide the photoresist mask, a photoresist layer is first positioned on the semiconductor layer that provides the fin structure 5, e.g., an layer of an SOI substrate or upper surface of bulk semiconductor substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structures 5. The etch process may be an anisotropic process, such as reactive ion etch (RIE).

Referring to FIG. 1, the fin structures 5 may have a height Hi ranging from 5 nm to 200 nm. In another embodiment, the fin structures 5 may have a height Hi ranging from 10 nm to 100 nm. In one example, the fin structures 5 may have a height Hi ranging from 20 nm to 50 nm. Each of the fin structures 5 may have a width $W_1$ of less than 20 nm. In another embodiment, the fin structures 5 have a width $W_1$ ranging from 3 nm to 8 nm. Although only one fin structures is depicted in FIG. 1, the present disclosure is not limited to only this example. It is noted that any number of fin structures 5 may be formed from the semiconductor substrate 1, in which multiple fin structures are depicted in FIGS. 2-5. The pitch separating adjacent fin structures 5 may range from 10 nm to 500 nm. In another example, the pitch separating adjacent fin structures in the plurality of fin structures 5 may range from 20 nm to 50 nm.

Figure 2:
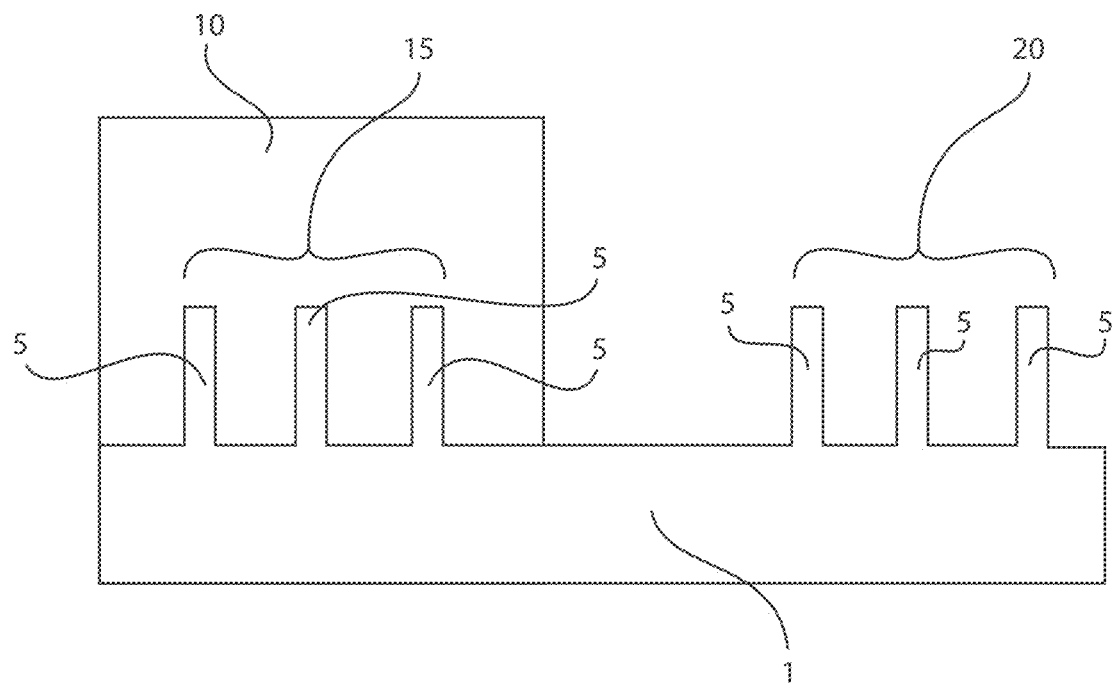
FIG. 2 is a side cross-sectional view depicting forming a mask over the fin structures that will be subsequently processed to provide n-type FinFETs, while leaving fin structures exposed to be converted to a germanium containing semiconductor material, in accordance with one embodiment of the present disclosure.

FIG. 2 depicts forming a block mask 10 over a first set 15 of fin structures 5 that will be subsequently processed to provide n-type FinFETs, while leaving a second set 20 of fin structures 5 exposed to be converted to a germanium containing semiconductor material. The block mask may be formed using at least one of deposition, photolithography and etch processing. For example, a block mask 10 may be formed overlying the portion of the semiconductor substrate 1 in which the first set 15 of fin structures 5 are present that are to remain germanium free for the production of n-type semiconductor devices, such as n-type FinFETs. The exposed portion of the semiconductor substrate 1 that includes the second set 20 fin structure 5 is not protected by the block mask 10, and are converted to a germanium containing semiconductor material, while the first set 15 of fin structures 5 are protected by the block mask 10.

The block mask 10 may comprise soft and/or hardmask materials and can be formed using deposition, photolithography and etching. In one embodiment, the block mask comprises a photoresist. A photoresist block mask can be produced by applying a photoresist layer, exposing the photoresist layer to a pattern of radiation, and then developing the pattern into the photoresist layer utilizing conventional resist developer. Typically, the block masks 10 have a thickness ranging from 100 nm to 300 nm.

Figure 3A:
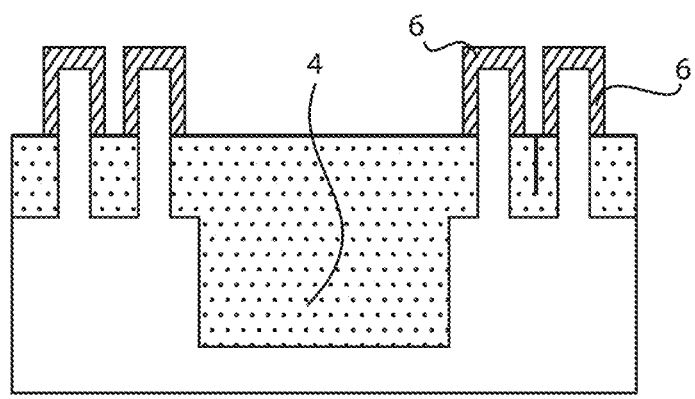
FIG. 3A is a side cross-sectional view depicting forming a germanium containing material layer on a fin structure, in accordance with one embodiment of the present disclosure.
Figure 3B:
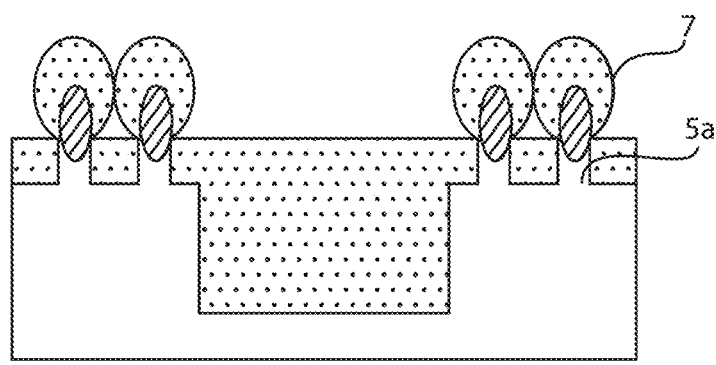
FIG. 3B is a side cross-sectional view depicting thermally annealing the structure in an oxidizing atmosphere to drive the germanium from the germanium containing material into the fin structure, in accordance with one embodiment of the present disclosure.
Figure 3C:
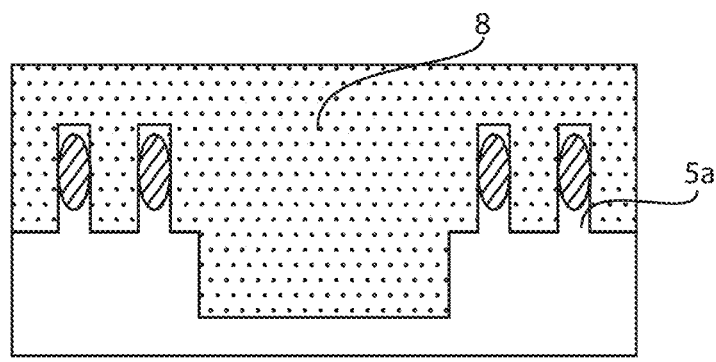
FIG. 3C is a side cross-sectional view depicting depositing a dielectric fills on the structure depicted in FIG. 3B, in accordance with one embodiment of the present disclosure.

FIGS. 3A-3C depict converting at least one of the fin structures 5 in the second set of fin structures 20 to germanium containing type fin structure 5a, wherein at least one remaining of the fin structures 5 that are present in the first set 15 of fin structures 5 is germanium free. For the purposes of simplicity FIGS. 3A-3C only depict the portion of the semiconductor substrate 1 that includes the second set 20 of fin structures 5. The first set 15 of fin structures 5 is protected during the process flow described in FIGS. 3A-3C by the block mask 10. In the embodiments depicted in FIGS. 3A-3C, a dielectric material 4, e.g., oxide, such as silicon oxide, is deposited between adjacent fin structures 5 prior to converting the at least one of the fin structures 5 to a germanium containing type fin structure 5a.

FIG. 3A depicts forming a germanium including layer 6 on a fin structure 5. In this embodiment, the germanium including layer 6 is formed on the sidewalls and upper surface of each fin structure in the plurality of fin structures 5. The germanium content of the germanium including layer 6 may range from 5% to 70%, by atomic weight %. In some embodiments, the germanium (Ge) content of the germanium including layer 6 may be greater than 20 at. %. In other embodiments, the germanium (Ge) content of the germanium including layer 6 ranges from 20 at. % to 100 at. %. In another embodiment, the germanium content of the germanium including layer 6 may range from 10% to 40%. In one example, the germanium including layer 6 may be pure germanium (Ge). Examples of materials suitable for the germanium including layer 6 include germanium (Ge), crystalline germanium, single crystal germanium, multicrystalline germanium, silicon germanium doped with carbon (SiGe:C), hydrogenated silicon germanium and combinations thereof.

In one embodiment, forming the germanium including layer 6 over the plurality of fin structures 5 includes epitaxially deposition/epitaxial growth. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

In some embodiments, epitaxial deposition of the germanium including layer 6 is a selective deposition process. For example, although the epitaxially deposited germanium including layer 6 orientates to the crystal arrangement of a semiconductor material, the epitaxially deposited germanium including layer 6 may not be deposited on the dielectric material 4 or the block mask 10 (not shown). In another embodiment, during the epitaxial deposition of the germanium including layer 6 on the fin structures 5, amorphous germanium material is deposited on dielectric surfaces, wherein the amorphous germanium material may be removed selectively, e.g., selectively etched, to the epitaxial germanium including layer 6 formed on fin structures 5.

A number of different sources may be used for the epitaxial deposition of germanium including layer 6. In some embodiments, the gas source for the deposition of an epitaxial germanium including layer 6 may include a germanium including gas sources. For example, an epitaxial germanium including layer 6 may be deposited from a germanium gas source that is selected from the group consisting of germane, digermane, halogermane, dichlorogermane, trichlorogermane, tetrachlorogermane and combinations thereof. In some embodiments, the germanium including gas source may be accompanied by a silicon including source gas that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. The temperature for epitaxial silicon germanium deposition typically ranges from 450° C. to 900° C. Although higher temperature typically results in faster deposition, the faster deposition may result in crystal defects and film cracking.

The epitaxially deposited germanium including layer 6 may be a conformally deposited layer. The term "conformal" denotes a layer having a thickness that does not deviate from greater than or less than 30% of an average value for the thickness of the layer. In one embodiment, the thickness of the germanium including layer 6 may range from 2 nm to 40 nm. In another embodiment, the thickness of the germanium including layer 6 may range from 3 nm to 10 nm.

FIG. 3B depicts thermally annealing the structure depicted in FIG. 3A in an oxidizing atmosphere to drive the germanium from the germanium including layer 6 into the fin structure 5 to form germanium containing type fin structures 5a. In one embodiment, the thermal annealing diffuses germanium from the germanium including layer 6 into the silicon including fin structures 5 to convert the silicon including fin structures 5 to germanium containing type fin structures 5a. In some embodiments, the intermixing of the germanium from the germanium including layer 6 into the silicon including fin structures 5 comprises thermal annealing. In one embodiment, the thermal annealing that intermixes the germanium including layer 6 into the silicon including fin structures 5 includes an annealing process selected from the group consisting of rapid thermal annealing (RTA), flash lamp annealing, furnace annealing, laser annealing and combinations thereof. In one embodiment, the thermal annealing for intermixing the germanium including layer 6 into the silicon including fin structures 5 may include a temperature ranging from 550° C. to 1100° C. In another embodiment, the thermal annealing for intermixing the germanium including layer 6 into the silicon including fin structures 5 may include a temperature ranging from 800° C. to 1200° C., and a time period ranging from 10 milliseconds to 100 seconds.

In one embodiment, the intermixing of the germanium including layer 6 into the silicon including fin structures 5 forms germanium containing type fin structure 5a having a germanium (Ge) content ranging from 10 at. % to 90 at. %. In another embodiment, the germanium containing type fin structure 5a may have a germanium (Ge) content ranging from 20 at. % to 60 at %. In yet another embodiment, the germanium containing type fin structure 5a may have a germanium (Ge) content ranging from 30 at. % to 50 at %.

Oxidization 7 of the upper surface of the germanium containing type fin structure 5a may occur during or after the process steps for intermixing the germanium including layer 6 into the silicon including fin structures 5. For example, in one embodiment in which the oxide layer is formed while intermixing the germanium from the germanium including layer 6 into the silicon including fin structures 5, the thermal processing is performed in an oxygen including atmosphere. The application of the oxygen including atmosphere forms the oxide, e.g., silicon oxide ($SiO_2$), on the upper surface of the germanium containing type fin structure 5a. In some embodiments, silicon (Si) atoms from the silicon germanium (SiGe) layer are preferentially oxidized.

FIG. 3C depicts filling the space between germanium containing type fin structures 5a with a fill dielectric material 8. The dielectric regions 8 may be composed of a nitride, oxide, oxynitride material, and/or any other suitable dielectric layer. For example, when the dielectric regions 8 are composed of an oxide, the dielectric regions 8 can be silicon oxide ($SiO_2$). In another example, when the dielectric regions 8 are composed of a nitride, the dielectric regions 8 can be silicon nitride. The dielectric regions 8 can be formed by a deposition process, such as CVD. Variations of CVD processes include, but not limited to, Atmospheric Pressure CVD (APCVD), Low Pressure CVD (LPCVD) and PECVD, Metal-Organic CVD (MOCVD) and combinations thereof. Alternatively, the dielectric regions 8 may be formed using a growth process, such as thermal oxidation or thermal nitridation.

Figure 4:
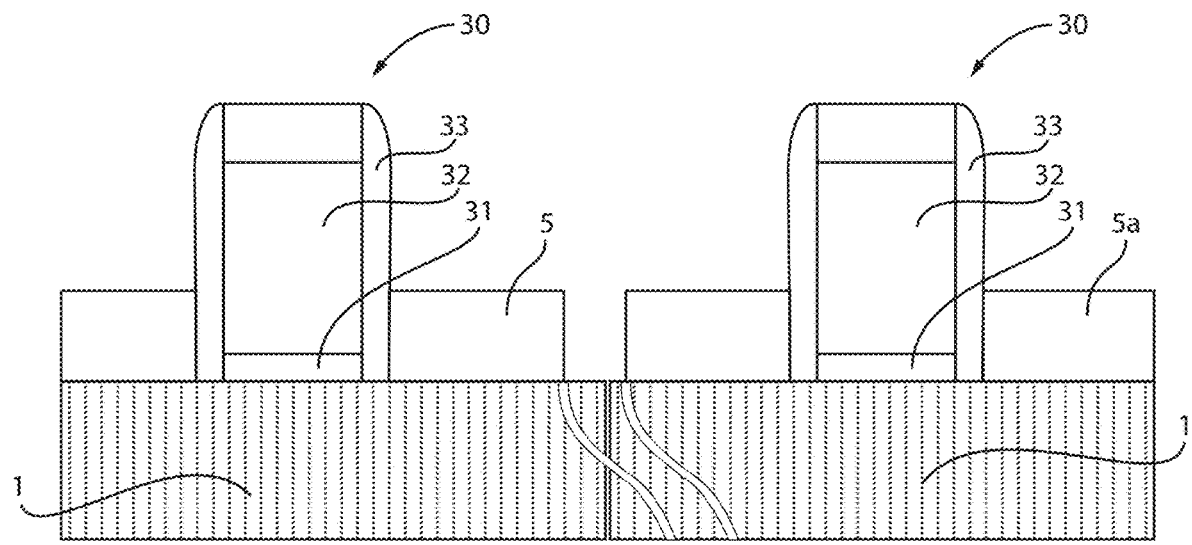
FIG. 4 is a side cross-sectional view depicting forming gate structures on channel region portions of the germanium containing type fin structures and the fin structures that are germanium free, in accordance with one embodiment of the present disclosure.

The dielectric regions 8 may be recessed using a selective etch process to provide the substrate region including the germanium containing type fin structure 5a similar to those depicted in FIG. 4. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. In some embodiments, the dielectric regions 8 are removed by an etch that is selective to the silicon germanium containing type fin structure 5a. The etch process for removing the dielectric regions 8 may be an anisotropic etch or an isotropic etch. In some examples, the etch process may be a wet chemical etch, reactive ion etch (RIE), plasma etch, laser etch and combinations thereof.

Figure 5:
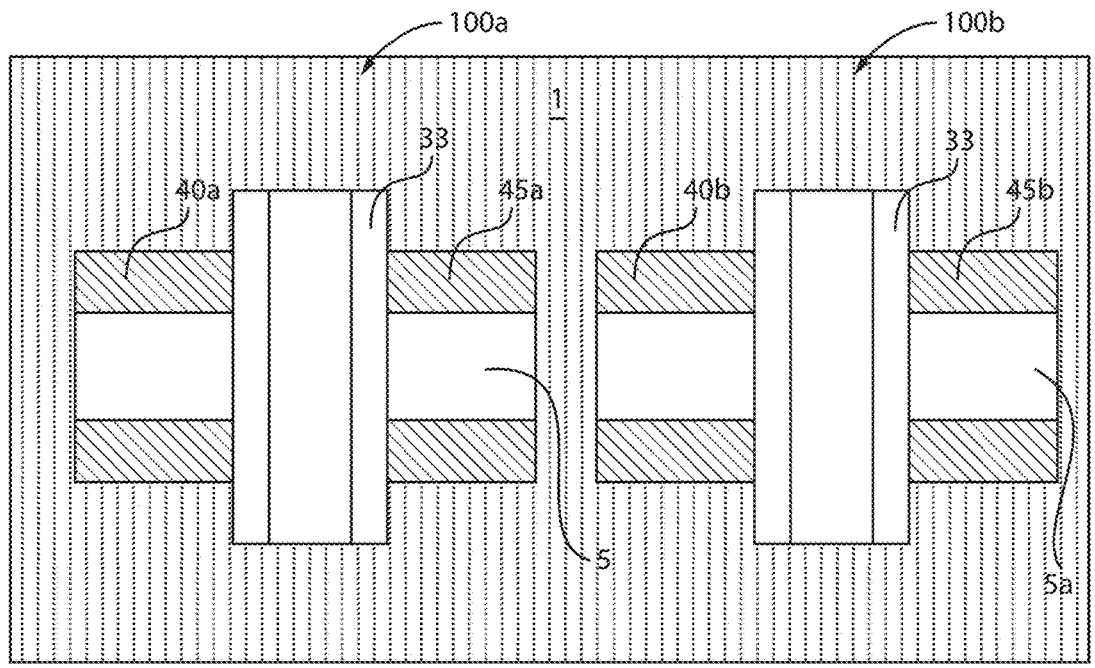
FIG. 5 is a side cross-sectional view depicting forming N-type epitaxial silicon having rectangular growth on the sidewalls having the (100) plane of the fin structures that are germanium free on opposing sides of the channel region, and forming P-type epitaxial silicon having rectangular growth on the sidewalls having the (100) plane of the germanium containing type fin structure on opposing sides of the channel region, in accordance with one embodiment of the present disclosure.
Figure 6:
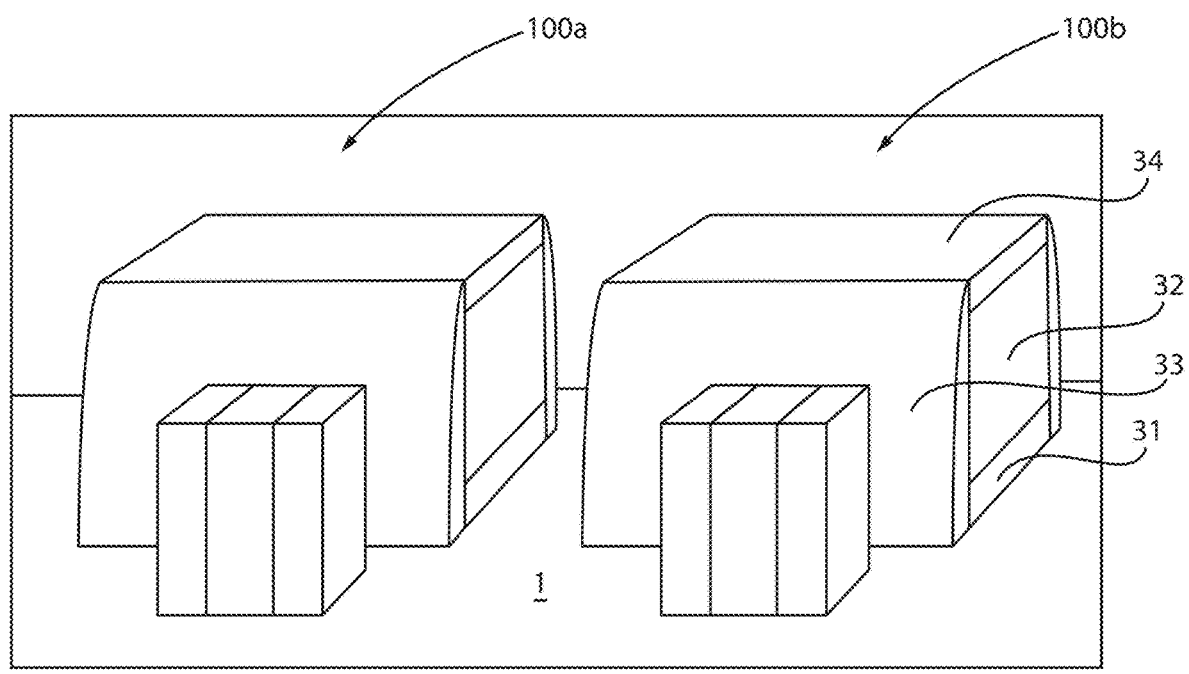
FIG. 6 is a perspective view of an n-type FinFET and a p-type FinFET that are formed in accordance with the present disclosure.

Following conversion of the second set of fin structures 5 to the germanium containing type fin structure 5a, the block mask 10 may be removed. The block mask 10 may be removed using selective etch, chemical dissolving or oxygen ashing. Referring to FIG. 4, a first region of the semiconductor substrate 1 includes a first set of fin structures 5 that include silicon and are substantially free of germanium; and a second region of the semiconductor substrate includes a second set 20 of the germanium containing type fin structure 5a. Following the formation of the germanium containing type fin structure 5a, further processing may be conducted to provide p-type finFETs 100b from the germanium containing type fin structure 5a and n-type FinFETs 100a from the fin structures 5 that include silicon and are substantially free of germanium as depicted in FIGS. 4-6. It is noted that the following process steps for producing a finFET 100 are provided for illustrative purposes and are not intended to limit the disclosure, as additional and intermediate processing steps that are not discussed herein are contemplated and are within the scope of the disclosure.

Referring to FIG. 4, in one embodiment, a gate structure 30 may be formed contacting the germanium containing type fin structure 5a and fin structures 5 that include silicon and are substantially free of germanium. A "gate structure" is a structure used to control output current (i.e., flow of carriers in the channel) of a semiconducting device through electrical fields.

The gate structure 30 may include at least one gate conductor 32 and at least one gate dielectric 31, wherein the gate dielectric 31 is positioned between the gate conductor 32 and the fin structures 5, 5a. The gate dielectric 31 is typically positioned on at least the vertical sidewalls of the fin structures 5a, 5b. The gate dielectric 31 may be formed by a thermal growth process such as, e.g., oxidation, nitridation or oxynitridation. The gate dielectric 31 may also be formed by a deposition process such as, e.g., CVD, plasma-assisted CVD, MOCVD, ALD, evaporation, reactive sputtering, chemical solution deposition and other like deposition processes. The gate dielectric 31 may also be formed utilizing any combination of the above processes.

The gate dielectric 31 may be comprised of an insulating material having a dielectric constant of about 4.0 or greater. In another embodiment, the gate dielectric 31 is comprised of an insulating material having a dielectric constant greater than 7.0. The dielectric constants mentioned herein are relative to a vacuum. In one embodiment, the gate dielectric 31 employed in the present disclosure includes, but is not limited to, an oxide, nitride, oxynitride and/or silicates including metal silicates, aluminates, titanates and nitrides. In one example, when the gate dielectric 31 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the gate dielectric 110 may vary, but typically, the gate dielectric 31 has a thickness from 1 nm to 10 nm. In another embodiment, the gate dielectric 31 has a thickness from 1 nm to 3 nm.

After forming the material layer for the gate dielectric 31, a blanket layer of a conductive material which forms the gate conductor 32 of gate structure 30 is formed on the gate dielectric 31 utilizing a deposition process, such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to, Al, W, Cu, and Ti or other like conductive metals. The blanket layer of conductive material may be doped or undoped. If doped, an in-situ doping deposition process may be employed. Alternatively, a doped conductive material can be formed by deposition, ion implantation and annealing.

In some embodiments, the gate structure 30 further includes a gate dielectric cap 34. The gate dielectric cap 34 may be a nitride, oxide or oxynitride material. In one embodiment, when the gate dielectric cap 34 is an oxide, the gate dielectric cap 34 may be composed of silicon oxide ($SiO_2$). In one embodiment, when the gate dielectric cap 34 is a nitride, the gate dielectric cap 34 may be composed of silicon nitride (SiN).

After deposition of at least the material layers for the gate dielectric 31, the gate conductor 32 and the gate dielectric cap 34, the gate structure 30 are patterned and etched using photolithography and etch processes. In one embodiment, the gate structures 30 are formed by first providing a patterned mask atop the conductive material by deposition and lithography and then transferring the pattern to the conductive material and the gate dielectric 31. The etching steps may comprise one or more etching processes including dry etching, such as RIE. The region of fin structure 5, 5a, in which the gate structure 30 crosses over is the channel region.

At least one dielectric gate spacer 33 may then be formed on the sidewall of the gate structure 30. In one embodiment, the dielectric gate spacer 33 may be formed by using a blanket layer deposition, such as CVD, and an anisotropic etchback method. The dielectric gate spacer 33 may have a width ranging from 2.0 nm to 15.0 nm, and may be composed of a dielectric, such as a nitride, oxide, oxynitride, or a combination thereof.

Referring to FIGS. 5 and 6, source regions 40a, 40b and drain regions 45a, 45b may be provided on opposing sides of the channel portion of the germanium containing type fin structure 5a and fin structures 5 that include silicon and are substantially free of germanium.

In some embodiments, N-type epitaxial semiconductor material having rectangular growth is formed on the source and drain portions of the sidewalls having the (100) plane of the fin structures that are germanium free to provide the source region 40a and drain region 45a of the N-type FinFET 100a. In some embodiments, P-type epitaxial semiconductor material having rectangular growth is formed on the source and drain portions of the sidewalls having the (100) plane of the germanium containing type fin structures to provide the source region 40b and drain region 45b of the P-type FinFET 100b.

As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region underlying the gate structure and between the source and drain of a semiconductor device that becomes conductive when the semiconductor device is turned on. The conductivity type of the source regions 40a, 40b, and the drain regions 45a, 45b dictates the conductivity type of the semiconductor device. The term "conductivity type" refers to whether the device is n-type or p-type. In the embodiments in which the finFET device being formed has n-type source and drain regions, and is referred to as an n-type finFET, the epitaxial semiconductor material that provides the source and drain regions 40a, 45a is doped with an n-type dopant to have an n-type conductivity. In the embodiments in which the finFET device being formed has p-type source and drain regions, and is referred to as a p-type finFET, the epitaxial semiconductor material that provides the source and drain regions 40b, 45b is doped with an n-type dopant to have an n-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous. The dopant for the epitaxial semiconductor material that dictates the conductivity type of the source and drain regions 40a, 40b, 45a, 45b is typically present in a concentration ranging from 1E17 atoms/cm$^3$ to 5E19 atoms/cm$^3$.

In some embodiments, the epitaxial semiconductor material that provides the source and drain regions 40a, 40b, 45a, 45b may be composed of silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. A number of different sources may be used for the epitaxial semiconductor material that provides the source and drain regions 40a, 40b, 45a, 45b. For example, a silicon including epitaxial semiconductor source and drain regions 40a, 40b, 45a, 45b may be deposited from a silicon including source gas that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming the epitaxial semiconductor material source and drain regions 40a, 40b, 45a, 45b includes germane, digermane, halogermane, dichlorogermane, trichlorogermane, tetrachlorogermane and combinations thereof.

As noted above, the epitaxial semiconductor material that provides the source and drain regions 40a, 40b, 45a, 45b in in-situ doped. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In one embodiment, the n-type gas dopant source may include arsine (AsH$_3$), phosphine (PH$_3$) and alkylphosphines, such as with the empirical formula R$_x$PH$_{(3-x)}$, where R=methyl, ethyl, propyl or butyl and x=1, 2 or 3. Alkylphosphines include trimethylphosphine ((CH$_3$)$_3$P), dimethylphosphine ((CH$_3$)$_2$PH), triethylphosphine ((CH$_3$CH$_2$)$_3$P) and diethylphosphine ((CH$_3$CH$_2$)$_2$PH). The p-type gas dopant source may include diborane (B$_2$H$_6$).

As noted above, the epitaxial grown on the source and drain portions of the fin structure sidewalls having the (100) plane is rectangular in geometry. This means that the outermost sidewall of the epitaxial semiconductor material that provides the source and drain regions 40a, 40b, 45a, 45b is parallel to the sidewall of the fin structure. This is distinguished from epitaxial semiconductor material that has a diamond like geometry. With a diamond like geometry instead of having an outer sidewall that is parallel to the outer sidewall of the fin structures, the diamond like geometry have a peaked sidewall or a sidewall having an apex positioned approximately at half the height of the fin structure 5. The epitaxial material for the source and drain regions 40a, 40b, 45a, 45b of the finFETs having the rectangular geometry has a defect density that is less than the defect density of epitaxial semiconductor material that has a diamond geometry.

FIG. 6 depicts one embodiment of an n-type FinFET 100a and a p-type FinFET 100b that are formed in accordance with the method described above. The semiconductor device may include a germanium containing fin structure 5a and the germanium free fin structure 5. A gate structure 30 is formed on a channel region of each of the germanium containing fin structure 5a and the germanium free fin structure 5. The p-type FinFET 100b may include at least one germanium containing fin structure 5a having a length along a <110> direction and a sidewall orientated along the (100) plane. In some examples, the fin structure 5a for the p-type FinFET 100b is composed of silicon germanium (SiGe), which is sensitive to strain in the <110>. Therefore, by positioning the length of the silicon germanium (SiGe) fin structure 5a of the p-type FinFET 100b in the <110> direction, and inducing a compressive strain in the silicon germanium fin structure 5a, the carrier speed of the p-type FinFET is increased. P-type epitaxial semiconductor material having a rectangular geometry is formed on the source and drain portions of the sidewalls having the (100) plane orientation of the germanium containing fin structures 5a. In some examples, the fin structure 5 of the n-type FinFET 100a is a germanium free fin structure having a length along a <100> direction and a sidewall orientated along the (100) plane. N-type epitaxial semiconductor material having a square geometry is present on the source and drain portions of the sidewalls having the (100) plane orientation of the germanium free fin structures 5 to provide the source region 20a and drain region 25a. The epitaxial semiconductor material, i.e., n-type and p-type epitaxial semiconductor material, having the rectangular geometry has a lesser defect density than similar epitaxial material having a diamond like geometry. For the n-type FinFET 100a, the reduced defect density that is provided by the rectangular geometry epitaxial material allows for reduced device leakage, which increases the performance of the n-type FinFET 100a. Additionally, the silicon (Si) fin structure 5, i.e., fin structure that is free of germanium, that is employed in the n-type FinFET is present on the (100) plane, which provides that the n-type FinFET has increased n-type carrier mobility.

It is noted that the above process sequence describes a gate first process sequence for forming FinFETs. The present disclosure is not limited to only gate first processing. For example, gate last, which is also referred to as replacement gate processing, is also suitable for use with the methods and structures of the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

The methods and structures that have been described above with reference to FIGS. 1-6 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
    forming a plurality of fin structures from a silicon containing semiconductor substrate, the silicon containing semiconductor substrate having a (110) wafer orientation, wherein said fin structures have a length in a <110> direction and sidewalls along the (100) plane;
    converting at least one of the fin structures to germanium containing type fin structures, wherein the sidewalls of the (100) plane for the fin structures formed from the silicon containing substrate are converted to sidewalls for the germanium containing type fin structures having a (100) plane; and
    forming p-type epitaxial semiconductor material having a rectangular geometry on source and drain portions of the germanium containing type fin structures, the p-type epitaxial semiconductor material being formed on the sidewalls for the germanium containing type fin structures having the (100) plane for the source and drain portions of the germanium containing type fin structures.

2. The method of claim 1, further comprising forming a silicon containing fin structure that has not been converted to a germanium type fin structure, wherein the silicon containing fin has a length along a <100> direction and a sidewall orientated along a (100) plane.

3. The method of claim 2, comprising forming n-type epitaxial semiconductor material having a rectangular geometry on the source and drain portions of the sidewall having the (100) plane of the silicon containing fin structure that have not been converted to the germanium type fin structure.

4. The method of claim 2, wherein the silicon containing fin structure that have not been converted to the germanium type fin structure are germanium free.

5. The method of claim 1, wherein the silicon containing semiconductor substrate is silicon (Si).

6. The method of claim 5, wherein the silicon containing semiconductor substrate is monocrystalline silicon (Si), microcrystalline silicon, or polycrystalline silicon (Si).

7. The method of claim 1, wherein said converting the at least one of the fin structures to germanium containing type fin structures, wherein at least one remaining of the fin structures is germanium free comprises:
    forming a germanium layer on said at least one of the fin structures that is to be converted to the germanium containing type fin structures; and
    diffusing germanium from the germanium layer into the at least one of the fin structures that provides the germanium containing type fin structure.

8. The method of claim 7, wherein the germanium layer is formed using an epitaxial growth process.

9. The method of claim 7, wherein said diffusing germanium from the germanium layer into the at least one of the fin structures comprises a thermal anneal.

10. The method of claim 9, wherein said thermal anneal is in an oxidizing atmosphere.

11. The method of claim 1, wherein the germanium containing type fin structures are under a compressive strain.

12. A method of forming a semiconductor device comprising:
    forming a plurality of fin structures from a silicon containing semiconductor substrate the silicon containing semiconductor substrate having a (110) plane orientation, wherein said fin structures have a length in a <110> direction and a sidewall along the (100) plane;
converting at least one of the fin structures to germanium containing type fin structures, wherein at least one remaining of the fin structures is germanium free;
forming gate structures on channel region portions of said germanium containing type fin structures and the fin structures that are germanium free;
forming N-type epitaxial semiconductor material having rectangular growth on the sidewalls having the (100) plane of the fin structures that are germanium free on opposing sides of the channel region; and
forming P-type epitaxial semiconductor material having rectangular growth on the sidewalls having the (100) plane of the germanium containing type fin structure on opposing sides of the channel region.

13. The method of claim 12, wherein said converting the at least one of the fin structures to germanium containing type fin structures, wherein said at least one remaining of the fin structures is germanium free comprises:
forming a block mask over fin structures that provide said at least one of said remaining of the fin structures that is germanium free, wherein fin structure that are converted to said germanium containing type fin structures are exposed;
forming a germanium layer on said at least one of the fin structures that is to be converted to the germanium containing type fin structures; and
diffusing germanium from the germanium layer into the at least one of the fin structures that provides the germanium containing type fin structure.

14. The method of claim 12, wherein the germanium layer is formed using an epitaxial growth process.

15. The method of claim 12, wherein said diffusing germanium from the germanium layer into the at least one of the fin structures comprises a thermal anneal.

16. The method of claim 13, wherein said thermal anneal is in an oxidizing atmosphere.

17. The method of claim 12, wherein the germanium containing type fin structures are under a compressive strain.

18. The method of claim 12, wherein the N-type epitaxial semiconductor material is unmerged.

19. The method of claim 12, wherein the P-type epitaxial semiconductor material is unmerged.

20. The method of claim 12, wherein the silicon containing semiconductor substrate is monocrystalline.

* * * * *